United States Patent
Shooshtari et al.

(10) Patent No.: US 9,422,190 B2
(45) Date of Patent: Aug. 23, 2016

(54) CURABLE FIBERGLASS BINDER COMPRISING A POLYACETAL OR POLYKETAL

(75) Inventors: Kiarash Alavi Shooshtari, Littleton, CO (US); Jawed Asrar, Englewood, CO (US)

(73) Assignee: Johns Manville, Denver, CO (US)

( * ) Notice: Subject to any disclaimer, the term of this patent is extended or adjusted under 35 U.S.C. 154(b) by 90 days.

(21) Appl. No.: 13/481,284

(22) Filed: May 25, 2012

(65) Prior Publication Data

US 2012/0245278 A1 Sep. 27, 2012

Related U.S. Application Data

(62) Division of application No. 11/245,668, filed on Oct. 7, 2005, now Pat. No. 8,211,974.

(51) Int. Cl.
| | |
|---|---|
| *C08F 8/28* | (2006.01) |
| *C03C 25/10* | (2006.01) |
| *C08L 29/14* | (2006.01) |
| *C09D 129/14* | (2006.01) |
| *C03C 25/32* | (2006.01) |
| *H01M 2/16* | (2006.01) |
| *H05K 1/03* | (2006.01) |

(52) U.S. Cl.
CPC .............. *C03C 25/10* (2013.01); *C03C 25/323* (2013.01); *C08F 8/28* (2013.01); *C08L 29/14* (2013.01); *C09D 129/14* (2013.01); *H01M 2/1613* (2013.01); *H05K 1/0366* (2013.01); *Y10T 428/2933* (2015.01)

(58) Field of Classification Search
CPC .......... C08L 29/14; C08F 8/28; C09D 129/14
USPC ........................................................ 524/593
See application file for complete search history.

(56) References Cited

U.S. PATENT DOCUMENTS

| | | | |
|---|---|---|---|
| 3,215,577 A | 11/1965 | Sinnott | |
| 3,844,790 A | 10/1974 | Chang et al. | |
| 3,978,092 A * | 8/1976 | Ichikawa et al. | ............ 549/498 |
| 3,997,613 A | 12/1976 | Lenke et al. | |
| 4,292,214 A | 9/1981 | Blount | |
| 5,143,582 A | 9/1992 | Arkens et al. | |
| 5,156,913 A | 10/1992 | Collins et al. | |
| 5,167,876 A | 12/1992 | Lem et al. | |
| 5,196,467 A | 3/1993 | Garrett | |
| 5,200,460 A | 4/1993 | Machado et al. | |
| 5,318,990 A | 6/1994 | Strauss | |
| 5,330,675 A * | 7/1994 | Kroner et al. | ................ 510/475 |
| 5,340,868 A | 8/1994 | Strauss et al. | |
| 5,427,587 A | 6/1995 | Arkens et al. | |
| 5,661,213 A | 8/1997 | Arkens et al. | |
| 5,914,430 A | 6/1999 | Fujii et al. | |
| 6,136,916 A | 10/2000 | Arkens et al. | |
| 6,221,973 B1 | 4/2001 | Arkens et al. | |
| 6,331,350 B1 | 12/2001 | Taylor et al. | |
| 6,531,215 B2 | 3/2003 | Yamazaki et al. | |
| 6,537,670 B1 | 3/2003 | Sassi | |
| 6,642,289 B2 | 11/2003 | Harashina et al. | |
| 6,753,363 B1 | 6/2004 | Harashina | |
| 6,992,130 B2 | 1/2006 | Kusudou et al. | |
| 2003/0055179 A1 | 3/2003 | Ota et al. | |
| 2004/0152835 A1 | 8/2004 | Kumaki et al. | |
| 2004/0166449 A1 | 8/2004 | Miyake | |

FOREIGN PATENT DOCUMENTS

| | | |
|---|---|---|
| EP | 0583086 | 11/1997 |
| WO | 2006048132 | 5/2006 |

OTHER PUBLICATIONS

Arkens, Charles T., et al., "Formaldehyde-Free Crosslinking Binders for Non-Wovens," TAPPI Journal 78 (11):161-168 (1995).

\* cited by examiner

*Primary Examiner* — Peter D Mulcahy
(74) *Attorney, Agent, or Firm* — Robert D. Touslee

(57) ABSTRACT

A curable formaldehyde-free binding composition for use with fiberglass is provided. Such curable composition comprises an acid-catalyzed reaction product of an aldehyde or ketone with a multihydric alcohol. When heated, the composition forms polyacetal or polyketal that undergoes curing to form a water-insoluble resin binder which exhibits good adhesion to glass. In a preferred embodiment, maleic anhydride initially serves as a catalyst and subsequently enters into a cross-linking reaction during curing to form a poly(esteracetal). Also, in a preferred embodiment, the fiberglass is in the form of building insulation. In other embodiments the product can be a microglass-based substrate for use in a printed circuit board, battery separator, filter stock, or reinforcement scrim.

17 Claims, No Drawings

CURABLE FIBERGLASS BINDER COMPRISING A POLYACETAL OR POLYKETAL

This application is a division of application Ser. No. 11/245,668, filed Oct. 7, 2005.

BACKGROUND OF THE INVENTION

1. Field of the Invention

The subject invention pertains to an improved binding composition for use with fiberglass. More specifically, the invention pertains to an improved curable composition comprising a reaction product of an aldehyde or ketone with a multihydric alcohol. When heated, the composition forms a polyacetal or polyketal that undergoes cross-linking upon curing to form a water-insoluble resin binder which exhibits good adhesion to glass. The cured binder of the present invention is useful as a fully acceptable replacement for formaldehyde-based binders in non-woven fiberglass products.

2. Description of the Related Art

Fiberglass binders have a variety of uses ranging from stiffening applications where the binder is applied to woven or non-woven fiberglass sheet goods and cured, producing a stiffer product; thermo-forming applications wherein the binder resin is applied to a sheet or lofty fibrous product, following which it is dried and optionally B-staged to form an intermediate but yet curable product; and to fully cured systems such as building insulation.

Fibrous glass insulation products generally comprise matted glass fibers bonded together by a cured thermoset polymeric material. Molten streams of glass are drawn into fibers of random lengths and blown into a forming chamber where they are randomly deposited as a mat onto a traveling conveyor. The fibers, while in transit in the forming chamber and while still hot from the drawing operation, are sprayed with an aqueous binder. A phenol-formaldehyde binder has been used throughout the fibrous glass insulation industry. The residual heat from the glass fibers and the flow of air through the fibrous mat during the forming operation are generally sufficient to volatilize water from the binder, thereby leaving the remaining components of the binder on the fibers as viscous or semi-viscous high solids liquid. The coated fibrous mat is transferred to a curing oven where heated air, for example, is blown through the mat to cure the binder and rigidly bond the glass fibers together.

Fiberglass binders used in the present sense should not be confused with matrix resins which are an entirely different and non-analogous field of art. While sometimes termed "binders", matrix resins act to fill the entire interstitial space between fibers, resulting in a dense, fiber reinforced product where the matrix must translate the fiber strength properties to the composite, whereas "binder resins" as used herein are not space-filling, but rather coat only the fibers, and particularly the junctions of fibers. Fiberglass binders also cannot be equated with paper or wood product "binders" where the adhesive properties are tailored to the chemical nature of the cellulosic substrates. Many such resins are not suitable for use as fiberglass binders. One skilled in the art of fiberglass binders would not look to cellulosic binders to solve any of the known problems associated with fiberglass binders.

Binders useful in fiberglass insulation products generally require a low viscosity in the uncured state, yet possess characteristics so as to form a rigid thermoset polymeric mat for the glass fibers when cured. A low binder viscosity in the uncured state is required to allow the mat to be sized correctly. Also, viscous binders commonly tend to be tacky or sticky and hence they lead to the accumulation of fiber on the forming chamber walls. This accumulated fiber may later fall onto the mat causing dense areas and product problems. A binder which forms a rigid matrix when cured is required so that a finished fiberglass thermal insulation product, when compressed for packaging and shipping, will recover to its as-made vertical dimension when installed in a building.

From among the many thermosetting polymers, numerous candidates for suitable thermosetting fiberglass binder resins exist. However, binder-coated fiberglass products are often of the commodity type, and thus cost becomes a driving factor, generally ruling out resins such as thermosetting polyurethanes, epoxies, and others. Due to their excellent cost/performance ratio, the resins of choice in the past have been phenol-formaldehyde resins. Phenol-formaldehyde resins can be economically produced, and can be extended with urea prior to use as a binder in many applications. Such urea-extended phenol-formaldehyde binders have been the mainstay of the fiberglass insulation industry for years, for example.

Over the past several decades however, minimization of volatile organic compound emissions (VOCs) and hazardous air pollutants (HAPS) both on the part of the industry desiring to provide a cleaner environment, as well as by Federal regulation, has led to extensive investigations into not only reducing emissions from the current formaldehyde-based binders, but also into candidate replacement binders. For example, subtle changes in the ratios of phenol to formaldehyde in the preparation of the basic phenol-formaldehyde resole resins, changes in catalysts, and addition of different and multiple formaldehyde scavengers, has resulted in considerable improvement in emissions from phenol-formaldehyde binders as compared with the binders previously used. However, with increasingly stringent Federal regulations, more and more attention has been paid to alternative binder systems which are free from formaldehyde.

One such candidate binder system employs polymers of acrylic acid as a first component, and a polyol such as glycerine or a modestly oxyalkylated glycerine as a curing or "crosslinking" component. The preparation and properties of such poly(acrylic acid)-based binders, including information relative to the VOC emissions, and a comparison of binder properties versus urea-formaldehyde binders is presented in "Formaldehyde-Free Crosslinking Binders For Non-Wovens," Charles T. Arkins et al., TAPPI Journal, Vol. 78, No. 11, pages 161-168, November 1995. The binders disclosed by the Arkins article appear to be B-stageable as well as being able to provide physical properties similar to those of urea/formaldehyde resins.

U.S. Pat. No. 5,340,868 discloses fiberglass insulation products cured with a combination of a polycarboxy polymer, α-hydroxyalkylamide, and at least one trifunctional monomeric carboxylic acid such as citric acid. The specific polycarboxy polymers disclosed are poly(acrylic acid) polymers. See also, U.S. Pat. No. 5,143,582.

U.S. Pat. No. 5,318,990 discloses a fibrous glass binder which comprises a polycarboxy polymer, a monomeric trihydric alcohol and a catalyst comprising an alkali metal salt of a phosphorous-containing organic acid.

Published European Patent Application EP 0 583 086 A1 appears to provide details of polyacrylic acid binders whose cure is catalyzed by a phosphorus-containing catalyst system as discussed in the Arkins article previously cited. Higher molecular weight poly(acrylic acids) are stated to provide polymers exhibiting more complete cure. See also U.S. Pat. Nos. 5,661,213; 5,427,587; 6,136,916; and 6,221,973.

Some polycarboxy polymers have been found useful for making fiberglass insulation products. Problems of clumping or sticking of the glass fibers to the inside of the forming chambers during the processing, as well as providing a final product that exhibits the recovery and rigidity necessary to provide a commercially acceptable fiberglass insulation product, have been overcome. See, for example, U.S. Pat. No. 6,331,350. The thermosetting acrylic resins have been found to be more hydrophilic than the traditional phenolic binders, however. This hydrophilicity can result in fiberglass insulation that is more prone to absorb liquid water, thereby possibly compromising the integrity of the product. Also, the thermosetting acrylic resins now being used as binding agents for fiberglass have been found to not react as effectively with silane coupling agents of the type traditionally used by the industry. The addition of silicone as a hydrophobing agent results in problems when abatement devices are used that are based on incineration. Also, the presence of silicone in the manufacturing process can interfere with the adhesion of certain facing substrates to the finished fiberglass material. Overcoming these problems will help to better utilize polycarboxy polymers in fiberglass binders.

Accordingly, in one aspect, the present invention provides a novel, non-phenol-formaldehyde binder.

In another aspect, the invention provides a novel fiberglass binder which provides advantageous flow properties, the possibility of lower binder usage, the possibility of overall lower energy consumption, elimination of interference by a silane, and improved overall economics.

These and other aspects of the present invention will become apparent to the skilled artisan upon a review of the following description and the claims appended hereto.

SUMMARY OF THE INVENTION

A curable composition for use in the binding of fiberglass is provided comprising an acid-catalyzed reaction product of an aldehyde or ketone with a multihydric alcohol in the form of a polyacetal or polyketal which upon curing is capable of forming a water-insoluble resin binder which exhibits good adhesion to glass.

A process for binding fiberglass is contemplated comprising providing on fiberglass a coating of a composition comprising an acid-catalyzed reaction product of an aldehyde or ketone with a multihydric alcohol in the form of a polyacetal or polyketal, and thereafter curing the composition while present as a coating on the fiberglass to form a water-insoluble resin binder which exhibits good adhesion to glass.

DETAILED DESCRIPTION OF PREFERRED EMBODIMENTS

The novel fiberglass binder composition is a curable composition comprising the acid-catalyzed reaction product of an aldehyde or ketone with a multihydric alcohol in the form of a polyacetal or polyketal which upon curing is capable of forming a water-insoluble resin binder which exhibits good adhesion to glass.

In accordance with one embodiment, the reactants comprise an aldehyde and a multihydric alcohol and a polyacetal is formed, and in a preferred embodiment thereof the polyacetal is a poly(ester-acetal). The aldehyde reactant can be a mono-aldehyde possessing a single aldehyde group or a multi-aldehyde possessing more than one aldehyde group. Representative mono-aldehydes include butyraldehyde, benzaldehyde, acrolein, a copolymer of acrolein with another unsaturated monomer, such as an acrylic acid, methacrylic acid, styrene, a vinyl monomer, and mixtures of these. Representative multi-aldehydes include glyoxal, glutaraldehyde, 1,5-pentanedial, 1,6-hexanedial, 1,4-terephthalic dianhydride, polyarolein, and mixtures of these. Preferred multi-aldehydes are glyoxal and glutaraldehyde. The multi-aldehydes make possible enhanced cross-linking in the cured reaction product.

Representative multihydric alcohols are ethylene glycol, 1,2-propylene glycol, 1,3-propylene glycol, neopentyl glycol, pentaerythritol, glucose, sorbitol, polyvinyl alcohol, ethylene vinyl alcohol copolymer, and mixtures of these. A preferred multihydric alcohol is polyvinyl alcohol.

In accordance with another embodiment, the reactants comprise a ketone and a multihydric alcohol and a polyketal is formed. The ketone reactant can contain one or more ketone group and the multihydric alcohol can be as described above when forming a polyacetal. When the ketone reactant includes more than one ketone group, enhanced cross-linking is made possible in the cured reaction product.

Representative ketone reactants include methylethyl ketone, methylisobutyl ketone, acetoquinone, cyclohexanedione, acetylacetone, benzophenone, polyketones, and mixtures of these. Preferred ketone reactants are methylisobutyl ketone and cyclohexanedione.

Suitable acids for use to catalyze the formation of the polyacetal or polyketal reaction product include mineral acids, Lewis acids, and organic acids. Representative acid catalysts include sulfuric acid, hydrochloric acid, sulfate salts, such as $Al_2(SO_4)_3$, bisulfite, such as $NaHSO_3$, $FeCl_3$, nitrate, such as $NaNO_3$, nitric acid, acetic acid, citric acid, glycolic acid, maleic acid, maleic anhydride, succinic acid, succinic anhydride, phthalic acid, polyacrylic acid, copolymers of acrylic acid, polymethacrylic acid, copolymers of methacrylic acid, polymers of styrene and maleic anhydride, homo- and copolymers of maleic acid, homo- and copolymers of maleic anhydride, rosin, and modified rosins, etc. Sulfuric acid is a preferred catalyst.

In a particularly preferred embodiment, when forming either a polyacetal or polyketal reaction product the catalyst is maleic acid, maleic anhydride, succinic acid, or succinic anhydride. Such compounds catalyze the initial formation of the polyacetal or polyketal and additionally enter into a chemical reaction to form a more highly cross-linked final reaction product. For instance, when the aldehyde and multihydric alcohol are reacted to form a polyacetal, and maleic acid is provided, the final polyacetal product possesses the chemical structure of a poly(ester-acetal).

The reactants can be applied to fiberglass as a coating while admixed in an aqueous medium. The composition when applied to the fiberglass optionally can include adhesion prompters, oxygen scavengers, solvents, emulsifiers, pigments, fillers, anti-migration aids, coalescents, wetting agents, biocides, plasticizers, organosilanes, anti-foaming agents, colorants, waxes, suspending agents, anti-oxidants, crosslinking catalysts, secondary crosslinkers, and combinations of these.

The coating application can be achieved in accordance with known techniques for coating a fibrous web. In preferred embodiments, these include spraying, spin-curtain coating, and dipping-roll coating. The composition can be applied to freshly-formed fiberglass, or to fiberglass following collection.

In a preferred embodiment, the fiberglass is building insulation. In other embodiments, the fiberglass is a microglass-based substrate useful when forming a printed circuit board, battery separator, filter stock, or reinforcement scrim.

Once applied to the fiberglass, the coated product is heated at a temperature and time sufficient to achieve the formation of a polyacetal or polyketal that subsequently undergoes curing to form a water-insoluble resin binder which exhibits good adhesion to glass. During the curing, water is formed as a by-product and is removed by volitization. Representative heating temperatures commonly are approximately 80 to 250° C., e.g. 80 to 200° C.

The cured polyacetal or polyketal at the conclusion of the curing step commonly is present as a secure coating on the fiberglass in a concentration of approximately 0.5 to 50 percent by weight of the fiberglass, and most preferably in a concentration of approximately 1 to 10 (e.g., 5 to 6) percent by weight of the fiberglass.

The cured polyacetal formed in accordance with the first embodiment is preferred over the cured polyketal of the second embodiment in view of its enhanced stability. However, satisfactory results nevertheless are achieved when practicing the second embodiment.

The present invention provides a formaldehyde-free route to form a securely bound formaldehyde-free fiberglass product. The binder composition of the present invention makes possible ease of coating application, the elimination of interference by a silane, and improved overall economics.

The following examples are presented to provide specific examples of the present invention. In each instance, the thin glass plate substrate that receives the coating can be replaced by fiberglass. It should be understood, however, that the invention is not limited to the specific details set forth in the Examples.

EXAMPLE 1

To 44 grams of a 10 percent solution of polyvinyl alcohol in water 3.6 grams of a 40 percent solution of glyoxal in water and 0.5 gram sulfuric acid catalyst were added with stirring. This liquid was coated on a thin glass plate and was heated at a temperature of 150° C. During heating a polyacetal was formed which subsequently underwent cross-linking to produce a tough water-insoluble coating that displayed excellent adhesion to glass. Upon dynamic mechanical analysis the cured resin coating displayed a storage modulus of 165 MPa at 200° C.

EXAMPLE 2

Example 1 was repeated with the exception that 5.0 grams of sulfuric acid catalyst were provided and the coated glass plate was heated at a temperature of 200° C. Upon dynamic mechanical analysis the cured resin coating displayed a storage modulus of 150 MPa at 200° C.

EXAMPLE 3

To 88 grams of a 10 percent solution of polyvinyl alcohol in water 3.6 grams of a 40 percent solution of glyoxal in water and 5.8 grams of maleic acid were added with stirring. This liquid was coated on a thin glass plate and was heated at a temperature of 200° C. During heating a polyacetal was formed and the maleic acid underwent reaction during curing to produce a tough water-insoluble coating that displayed excellent adhesion to glass in the form of a poly(ester-acetal). Upon dynamic mechanical analysis the cured resin coating displayed a storage modulus of 170 MPa at 200° C.

EXAMPLE 4

To 2,200 grams of a 10 percent solution of polyvinyl alcohol in water 36.25 grams of a 40 percent solution of glyoxal in water and 232 grams of maleic acid were added with stirring. This liquid was coated on a thin glass plate and was heated at a temperature of 200° C. During heating a polyacetal was formed and the maleic acid underwent reaction during curing to produce a tough water-insoluble coating that displayed excellent adhesion to glass in the form of a poly(ester-acetal).

EXAMPLE 5

Example 4 was repeated with the exception that 1,320 grams of the 10 percent solution of polyvinyl alcohol in water, and 116 grams of maleic acid were utilized. The resulting water-insoluble poly(ester-acetal) coating displayed excellent adhesion to glass.

EXAMPLE 6

Example 4 was repeated with the exception that 880 grams of the 10 percent solution of polyvinyl alcohol in water, and 58 grams of maleic anhydride were utilized. The resulting water-insoluble poly(ester-acetal) coating displayed excellent adhesion to glass.

EXAMPLE 7

Example 4 was repeated with the exception that 1,320 grams of the 10 percent solution of polyvinyl alcohol in water, 72.5 grams of the 40 percent solution of glyoxal in water, and 58 grams of maleic anhydride were utilized. The resulting water-insoluble poly(ester-acetal) coating displayed excellent adhesion to glass.

EXAMPLE 8

Example 4 was repeated with the exception that 145 grams of the 40 percent solution of glyoxal in water, and 58 grams of maleic anhydride were utilized. The resulting water-insoluble poly(ester-acetal) coating displayed excellent adhesion to glass.

EXAMPLE 9

To 100 grams of a 10 percent solution of polyvinyl alcohol in water 0.53 gram of benzaldehyde, and 0.58 gram of maleic anhydride were added with stirring. This liquid was coated on a thin glass plate and was heated at a temperature of 200° C. During heating a polyacetal was formed and the maleic acid underwent reaction during curing to produce a tough water-insoluble coating that displayed excellent adhesion to glass in the form of a poly(ester-acetal). Heating at 200° C. for 10 minutes was sufficient to cure the resin.

EXAMPLE 10

To 100 grams of a 10 percent solution of polyvinyl alcohol, 0.49 gram methylisobutyl ketone, and 0.58 gram of maleic acid were added with stirring and were heated at 50° C. for five minutes until uniform. This liquid was coated on a thin glass plate and was heated at 200° C. for 10 minutes. During heating a cross-linked polyketal was formed and cured to produce a tough water-insoluble coating that displayed excellent adhesion to glass.

EXAMPLE 11

Example 10 was repeated with the exception that 0.28 gram of cyclohexanedione was substituted for the methylisobutyl ketone. The resulting cross-linked polyketal coating displayed excellent adhesion to glass.

EXAMPLE 12

To 1760 g of a 10% solution of polyvinyl alcohol in water, 108.8 g of a 40% solution of glyoxal was added. 1.0 g sulfuric acid was added to this solution. The resulting solution was cured at 160° C. to produce a hard and water insoluble film with excellent adhesion to glass. Performance of this resin was superior to those of Example 1 and Example 2.

EXAMPLE 13

Example 12 was repeated with the exception that the sulfuric acid was replaced with 4.0 g of aluminum sulfate. The resulting solution was cured at 160° C. to produce a hard and water insoluble film with excellent adhesion to glass.

EXAMPLE 14

Example 13 was repeated with the exception that 72.5 g glyoxal solution was used. The resulting solution was cured at 160° C. to produce a hard and water insoluble film with excellent adhesion to glass.

EXAMPLE 15

Example 14 was repeated with the exception that the aluminum sulfate was replaced with 1.0 g of sulfuric acid. The resulting solution was cured at 160° C. to produce a hard and water insoluble film with excellent adhesion to glass.

The principles, preferred embodiments, and modes of operation of the present invention have been described in the foregoing specification. The invention which is protected herein, however, is not to be construed as limited to the particular forms disclosed, since these are to be regarded as illustrative rather than restrictive. Variations and changes may be made by those skilled in the art without departing from the spirit of the invention.

We claim:

1. A fiberglass binder comprising a curable composition comprised of an acid-catalyzed reaction product of an aldehyde or a ketone with a multihydric alcohol in the form of a polyacetal or a polyketal which upon curing is capable of forming a water-insoluble resin binder which exhibits good adhesion to glass, with an acid catalyst for the reaction selected from the group consisting of maleic acid, maleic anhydride, succinic acid, and succinic anhydride.

2. The fiberglass binder according to claim 1, wherein the acid-catalyzed reaction product is formed by the reaction of the aldehyde with the multihydric alcohol and the polyacetal is formed.

3. The fiberglass binder according to claim 2, wherein said aldehyde is a mono-aldehyde.

4. The fiberglass binder according to claim 3, wherein the mono-aldehyde selected from the group consisting of butyraldehyde, benzaldehyde, acrolein, a copolymer of acrolein with another unsaturated monomer, and mixtures of the foregoing.

5. The fiberglass binder according to claim 2, wherein said aldehyde is a multi-aldehyde.

6. The fiberglass binder according to claim 5, wherein said multi-aldehyde is selected from the group consisting of glyoxal, glutaraldehyde, 1,5-pentanedial, 1,6-hexanedial, 1,4-terephthalic dianhydride, polyarolein, and mixtures of the foregoing.

7. The fiberglass binder according to claim 2, wherein said aldehyde is glyoxal.

8. The fiberglass binder according to claim 2, wherein said multihydric alcohol is selected from the group consisting of ethylene glycol, 1,2-propylene glycol, 1,3-propylene glycol, neopentyl glycol, pentaerythrytol, glucose, sorbitol, polyvinyl alcohol, ethylene vinyl alcohol copolymer, and mixtures of the foregoing.

9. The fiberglass binder according to claim 2, wherein said multihydric alcohol is polyvinyl alcohol.

10. The fiberglass binder according to claim 2 wherein the acid catalyst is maleic acid and is capable of undergoing reaction to form a poly(ester-acetal) during curing.

11. The fiberglass binder according to claim 1, wherein the acid-catalyzed reaction product is formed by the reaction of the ketone with the multihydric alcohol and the polyketal is formed.

12. The fiberglass binder according to claim 11, wherein said ketone is selected from the group consisting of methylethyl ketone, methylisobutyl ketone, acetoquinone, cyclohexanedione, acetylacetone, benzophenone, polyketones, and mixtures of the foregoing.

13. The fiberglass binder according to claim 11, wherein said ketone is methylisobutyl ketone.

14. The fiberglass binder according to claim 11, wherein said ketone is cyclohexanedione.

15. The fiberglass binder according to claim 11, wherein said multihydric alcohol is selected from the group consisting of ethylene glycol, 1,2-propylene glycol, 1,3-propylene glycol, neopentyl glycol, pentaerythrytol, glucose, sorbitol, polyvinyl alcohol, ethylene vinyl alcohol copolymer, and mixtures of the foregoing.

16. The fiberglass binder according to claim 11, wherein said multihydric alcohol is polyvinyl alcohol.

17. The fiberglass binder according to claim 11, wherein said acid catalyst is maleic acid.

* * * * *